United States Patent
Kim et al.

(10) Patent No.: US 12,252,780 B2
(45) Date of Patent: Mar. 18, 2025

(54) GROWTH METHOD OF HIGHLY TWINNED SIGE ALLOY ON THE BASAL PLANE OF TRIGONAL SUBSTRATE UNDER ELECTRON BEAM IRRADIATION

(71) Applicant: UNITED STATES OF AMERICA AS REPRESENTED BY THE ADMINISTRATOR OF NASA, Washington, DC (US)

(72) Inventors: Hyun Jung Kim, Poquoson, VA (US); Sang H. Choi, Poquoson, VA (US); Yeonjoon Park, Fairfax, VA (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 16 days.

(21) Appl. No.: 18/346,402

(22) Filed: Jul. 3, 2023

(65) Prior Publication Data
US 2025/0011920 A1    Jan. 9, 2025

(51) Int. Cl.
C23C 14/58    (2006.01)
C23C 14/14    (2006.01)
C23C 14/34    (2006.01)

(52) U.S. Cl.
CPC .......... C23C 14/5826 (2013.01); C23C 14/14 (2013.01); C23C 14/34 (2013.01)

(58) Field of Classification Search
CPC ..... C23C 14/14; C23C 14/34; C23C 14/5826; C23C 14/06; C23C 14/18; G01N 23/207; H01L 21/0242; H01L 21/266
See application file for complete search history.

(56) References Cited

U.S. PATENT DOCUMENTS 7,517,776 B2 * 4/2009 Xie .................. H01L 29/1054
                                                                  438/528
8,257,491 B2 * 9/2012 Park .................. G01N 23/207
                                                                  117/1

OTHER PUBLICATIONS

Rowe, D. M., et al., "a-In o Plot as a Thermoelectric Material Performance Indicator," Journal of Materials Science Letters, 1995, pp. 617-619, vol. 14.
Fueller, T. et al., "In Situ Observation of the Formation and Stability of Single Fullerence Molecules Under Electron Irradiation," Chemical Physics Letters, 1996, pp. 372-378, No. 254.
Dresselhaus, M. S. et al., "New Directions for Low-Dimensional Thermoelectric Materials," Advanced Materials, 2007, pp. 1043-1053, vol. 19.
Chen, G., et al., "recent Developments in Thermoelectric Materials," International Materials Review, 2013, pp. 45-66, vol. 48 Issue 1.

(Continued)

*Primary Examiner* — Michael P Wieczorek
(74) *Attorney, Agent, or Firm* — Matthew R. Osenga; Jennifer L. Riley; Trenton R. Roche

(57) ABSTRACT

Methods and systems that enable growing a SiGe film at relative high temperature resulting in single crystalline properties and imparting twin crystal structures and/or dislocation to the SiGe film through either in-situ or ex-situ electron-beam irradiation. The various embodiments may maintain (or increase) the Seeback coefficient and electrical conductivity of thermoelectric materials and simultaneously decrease the thermal conductivity of the thermoelectric materials.

18 Claims, 10 Drawing Sheets

(56) References Cited

OTHER PUBLICATIONS

Zide, J.M. 0. et al., "Demonstration of Electron filtering to Increase the Seebeck Coefficient in In0.53Ga0.47As/In0.53Ga0.28Al0.19As Superlattices," Physical Review, 2006, pp. 1-5, Rev. B.

Nolas, G. S., et al., "Recent Developments in Bulk Thermoelectric Materials," 2006, pp. 199-205, vol. 31.

Kauzlarich, S. M., et al., "Zintl Phases for Thermoelectric Devices," The Royal Society of Chemistry, 2007, pp. 2099-2107, Dalton Transactions.

Y. Park, et al., "Rhombohedral Epitaxy of Cubic SiGe on Trigonal c-plane Sapphire," Journal of Crystal Growth, 2008, pp. 2724-2731, No. 310.

Kim, Hyun Jung, et al., Crystal Lattice Controlled SiGe Thermoelectric Materials with High Figure of Merit, 2011, pp. 1-9.

Slack, G. A., "New Materials and Performance Limits for Thermoelectric Cooling," CRC Handbook of Thermoelectrics pp. 407-440, 1995, CRC Press Inc.

Harman, T.C, et al., "Quantum Dot Superlattice Thermoelectric Materials and Devices," Science, 2002, pp. 2229-2233, vol. 297.

Venkatasubramanian, R. et al., "Thin-Film Thermoelectric Devices With High Room-Temperature Figures of Merit," Macmillian Magazine Ltd., 2001, pp. 597-600, vol. 413.

Jencic, I., et al., "Crystallization of Isolated Amorphous Zones in Semiconductors," Philosophical Magazine, 2003, pp. 2557-2571, vol. 83.

Kaiser, M., et al., "In Situ Transmission Electron Microscopy Analysis of Electron Beam Induced Crystallization of Amorphous Marks in Phase-Change Materials," Journal of Applied Physics, 2004, 3193-3198, vol. 96, No. 6.

Xu, Z.W., et al., "TEM Study of Electron Beam-Induced Crystallization of Amorphous GeSi Films," Philosophical Magazine Letters, 2004, pp. 719-728, vol. 84, No. 11.

\* cited by examiner

GROWTH METHOD OF HIGHLY TWINNED SIGE ALLOY ON THE BASAL PLANE OF TRIGONAL SUBSTRATE UNDER ELECTRON BEAM IRRADIATION

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

1. Field of the Invention

The present invention relates to thermoelectric materials and more particularly to methods of making thermoelectric materials using electron beam ("e-beam") irradiation.

2. Description of the Related Art

The world's demand for energy along with industrialization and cultural furtherance of many nations has caused a dramatic escalation of social and political unrest driven by the shortage of energy resources. Also, the environmental impact on global climate change due to the increasing consumption of fossil fuels has become a serious and alarming social concern. The current host of energy conversion systems used for power generation have very low conversion efficiency, such as approximately 30%, and the rest of the energy is wasted. In this regard, it is important to develop energy recovery systems to reuse the wasted energy, as well as developing new energy sources. One of the possible energy recovery systems is the thermoelectric device which scavenges and converts waste heat into useful electric power. Thermoelectric generators are solid-state devices with no moving parts, are silent, are reliable, and are scalable, making thermoelectric generators ideal for small, distributed power generation. Thermoelectrics have long been too inefficient to be cost-effective in most applications. However, a resurgence of interest in thermoelectrics began in the mid 1990s when theoretical predictions suggested that thermoelectric efficiency could be greatly enhanced through nanostructure fabrication, which led to experimental efforts to demonstrate the proof-of-principle and high-efficiency materials. At the same time, complex bulk materials, such as skutterudites, clathrates, and Zintl phases, have been explored and found that high efficiencies could indeed be obtained.

Glasses exhibit some of the lowest lattice thermal conductivities. In a glass, thermal conductivity is viewed as a random walk of energy through a lattice rather than rapid transport via phonons, and leads to the concept of a minimum thermal conductivity, $\kappa_{min}$. Actual glasses, however, make poor thermoelectrics because they lack the needed 'electron-crystal' property when compared with crystalline semiconductors and the glasses have lower mobility due to increased electron scattering and lower effective masses because of broader bands. Good thermoelectrics are therefore crystalline materials that manage to scatter phonons without significantly disrupting the electrical conductivity. Thermoelectrics therefore require a rather unusual material, specifically a 'phonon-glass electron crystal'. The electron-crystal requirement stems from the fact that crystalline semiconductors have been the best at meeting the compromises required from the electronic properties (e.g., Seebeck coefficient and electrical conductivity). The phonon-glass requirement stems from the need for as low a lattice thermal conductivity as possible.

BRIEF SUMMARY OF THE INVENTION

The various embodiments provide methods and systems that enable growing a SiGe film at relative high temperature resulting in single crystalline properties and imparting an amount of twin crystal structures and/or dislocation to the SiGe film through either in-situ or ex-situ electron-beam irradiation. The various embodiments may maintain (or increase) the Seeback coefficient and electrical conductivity of thermoelectric materials and simultaneously decrease the thermal conductivity of the thermoelectric materials.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION OF THE INVENTION

Figure 1:
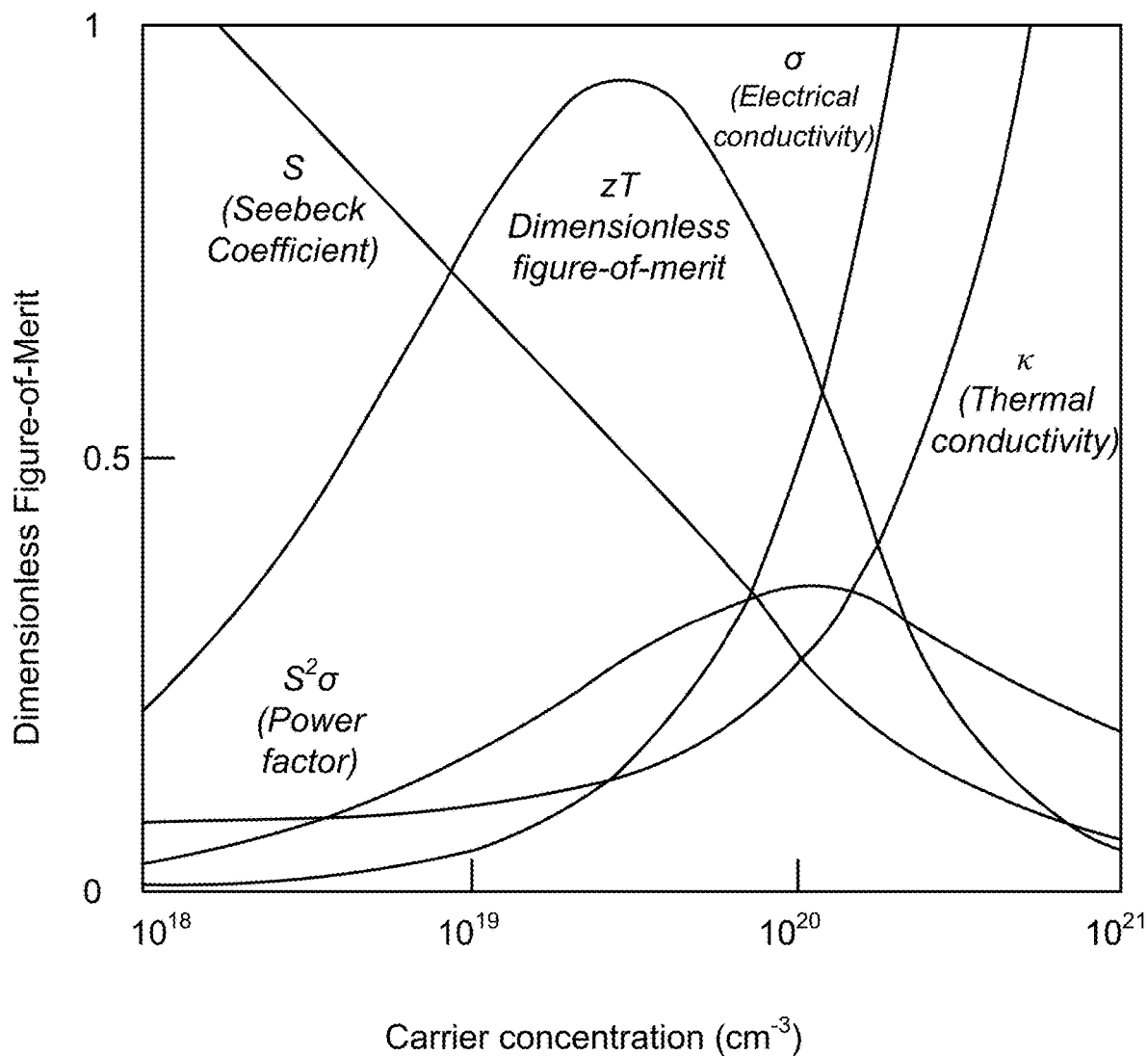
FIG. 1 is a graph of dimensionless figure of merit (ZT) versus carrier concentration.

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration." Any implementation described herein as "exemplary" is not necessarily to be construed as preferred or advantageous over other implementations.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

There may be three general strategies to reduce lattice thermal conductivity. The first strategy may be to scatter phonons within the unit cell by creating rattling structures or point defects such as interstitials, vacancies, or by alloying. The second strategy may be to use complex crystal structures to separate the electro-crystal from the phonon-glass. A phonon glass may be the material structure that can be fabricated under certain conditions without disrupting the crystallinity of the electron-transport region. The third strategy may be to scatter phonons at interfaces, leading to the use of multiphase composites mixed on the nanometer scale. These nanostructured materials may be formed as thin-film superlattices or as intimately mixed composite structures. Most recently, significant enhancements of the thermoelectric figure-of-merit were reported in $Bi_2Te_3/Sb_2Se_3$ superlattices along the cross-plane direction and PbTe/PbTeSe quantum-dot superlattices along the film-plane direction.

In the various embodiments, crystalline structures of Silicon Germanium ("SiGe") may be engineered to create the stacking faults by twin lattice structures for either phonon reflections through-plane or along the film plane. In various embodiments, the crystalline structure of SiGe may be tailored with application of either ex-situ or in-situ e-beam irradiation. The various embodiments may provide methods and systems that enable growing a SiGe film at a relatively high temperature resulting in single crystalline properties and imparting an amount of twin crystal structures and/or dislocation to the SiGe film through either in-situ or ex-situ electron-beam irradiation. The various embodiments may maintain (or increase) the Seebeck coefficient and electrical conductivity of thermoelectric materials and simultaneously decrease the thermal conductivity of the thermoelectric materials.

Electron and photon irradiations may be alternative methods for crystallization, especially in isolated amorphous zones in semiconductors. And the process for sputtering and reordering of atoms by collisions of electrons may explain the formation and stability of fullerene molecules on graphitic surfaces. Electron beam ("e-beam") irradiation is usually used for structural phase change or transformation of materials. The various embodiments may provide structure reconstruction by e-beam irradiation effective for providing the reordered twin lattice structure. In various embodiments, in a bulk mode, the crystalline structure of SiGe irradiated by e-beam may be amorphized, but in the lattice structure the twin modality of SiGe may be formed. The twin modality of lattice structure in a periodic formation may be very useful for phonon scattering which may be a key parameter of raising the figure-of-merit of thermoelectric materials.

The various embodiments provide methods to create periodically oriented SiGe alloys in the {111} direction with high density of stacking faults and twin crystals while keeping a Seebeck coefficient and electrical conductivity.

The performance of a thermoelectric material for both power generation and cooling may be determined by the figure of merit (ZT) of the thermoelectric material according to the equation $ZT=S^2\sigma T/\kappa$, where S is the Seebeck coefficient, σ the electrical conductivity, κ the thermal conductivity, and T the temperature. As this equation indicates, the performance of the thermoelectric material may improve if the material intrinsically has a high Seebeck coefficient, a high electrical conductivity, and a low thermal conductivity.

FIG. 1 shows the curves of thermoelectric materials parameters which may be related with the efficiency based on the carrier density. FIG. 1 illustrates the compromise that must be balanced between large thermopower and high electrical conductivity in thermoelectric materials. Optimizing the ZT through carrier concentration tuning may be beneficial, but may involve compromising thermal conductivity and Seebeck coefficient with electrical conductivity. To maximize the ZT, the carrier concentration may be compromised at $2\times10^{19}$ level between $10^{19}$ and $10^{20}$ carriers per $cm^3$, depending on the material system. The optimized level of carrier concentration may fall within or between common metals and semiconductors. That is, such a level of carrier concentrations may be found in heavily doped semiconductors. The concentration of the electrons or holes may be easily manipulated by doping control during the growth of the SiGe films. The various embodiments enable control of these parameters, (i.e. Seebeck coefficient, electrical conductivity, thermal conductivity, and doping concentrations). As mentioned above, in the various embodiments, the Seeback coefficient and electrical conductivity may be maintained by controlling the growth temperature while growing the single crystalline SiGe film. Previous attempts at SiGe film growth on sapphire substrate have required the SiGe film to be grown at relatively low temperature in order to get more twin boundaries and dislocations for phonon scattering. But, the morphology of film was degraded, which reduced the Seeback coefficient and the electrical conductivity, thereby resulting in the decrease of the figure-of-merit. The various embodiments may overcome these deficiencies of past attempts at SiGe film growth. The various embodiments may solve the problems by growing the SiGe film at a relatively high temperature for the single crystalline properties and by controlling the amount of twins or dislocation through either in-situ or ex-situ electron-beam irradiation. This may maintain (or increase) the Seeback coefficient and electrical conductivity and simultaneously decrease the thermal conductivity. In the various embodiments, a simultaneous decrease in thermal conductivity may be achieved in the SiGe film by introducing stacking faults and twin crystals through either in-situ or ex-situ e-beam irradiation. Also, in the various embodiments the growth method of SiGe film may be a sputtering process, and thereby it may be easy to control the doping concentration of dopants with boron or phosphorous.

Figure 2:
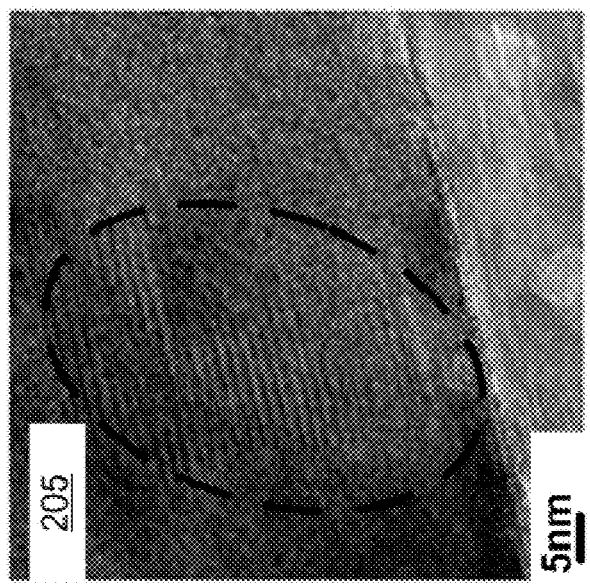
FIG. 2 is a compilation of cross sectional transmission electron microscope ("TEM") images of the same site of a Silicon Germanium ("SiGe") film before and after TEM e-beam irradiation for one hour at 195 K magnification.
Figure 2:
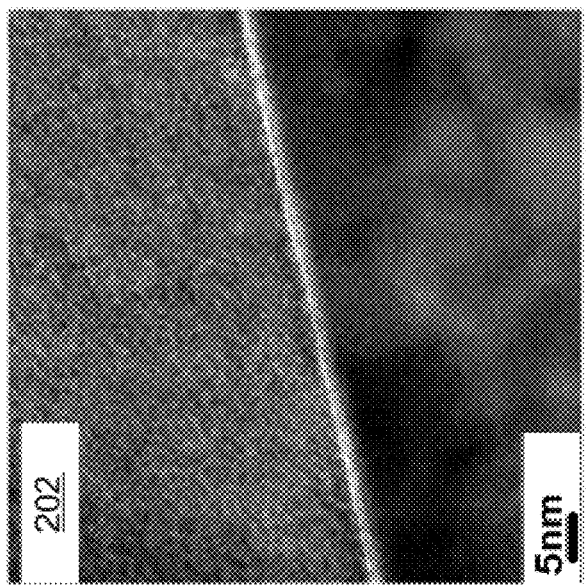
Figure 2:
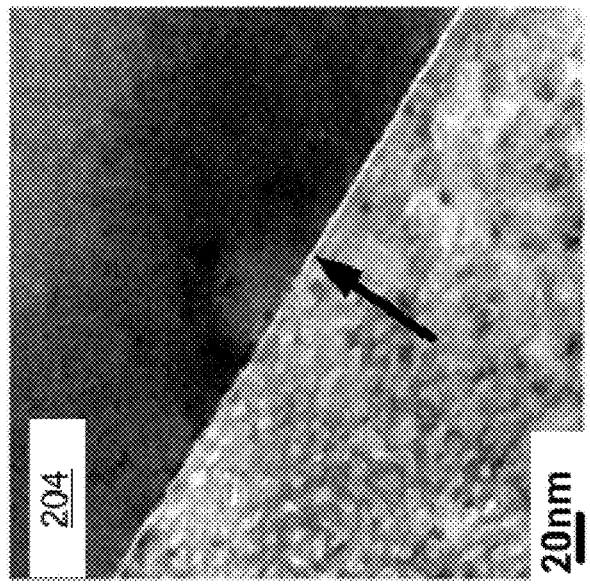
Figure 2:
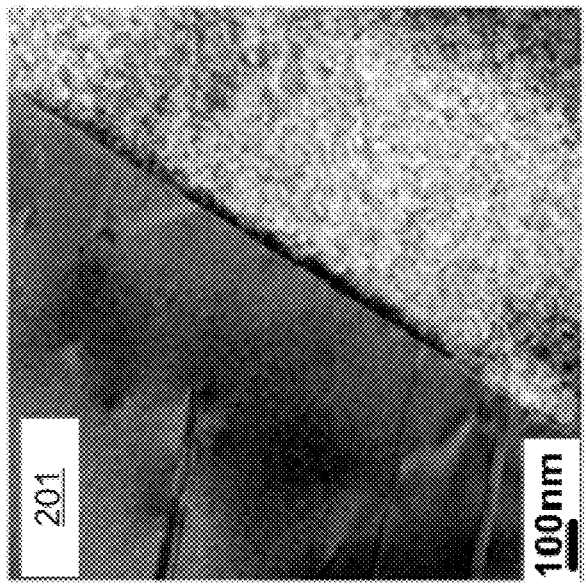
Figure 2:
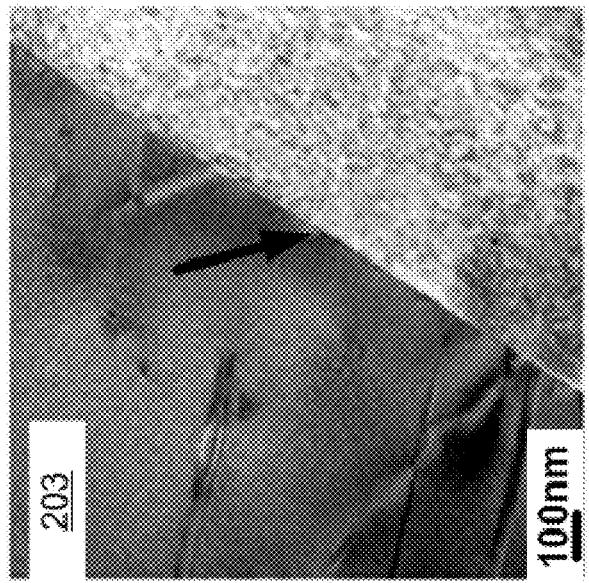

In the various embodiments, the transmission electron microscope ("TEM") beam use for in-situ or ex-situ e-beam irradiation of the SiGe film may be composed of electrons having a specific energy. FIG. 2 is a compilation of cross sectional TEM images 201, 202, 203, 204, and 205 of the same site of a SiGe film before and after embodiment TEM e-beam irradiation for one hour at 195 K magnification. Images 203, 204, and 205 illustrate that stacking faults and dislocation were formed by TEM beam for 1 hr at the site marked by arrows (in 203 and 204) and a circle (in 205). The pictures 201, 202, 203, 204, and 205 are at different magnifications, with pictures 201 and 203 at the same lesser magnification, picture 204 is at a middle magnification, and pictures 202 and 205 at a same greater magnification. FIG. 2 shows the TEM bright field image and high-resolution TEM image of the same site of SiGe film before (in pictures 201 and 202) and after (in pictures 203, 204, and 205) the electron beam irradiation from TEM for 1 hr at 195K magnification. There may be no stacking faults and dislocation at the interface between SiGe and sapphire substrate before the TEM e-beam irradiation for 1 hr at 195K magnification as shown in the high-resolution TEM image picture 201. However, after the TEM e-beam irradiation for 1 hour at 195K magnification, the stacking faults and dislocation were clearly seen within the circled region in the high-resolution TEM image picture 205.

Figure 3:
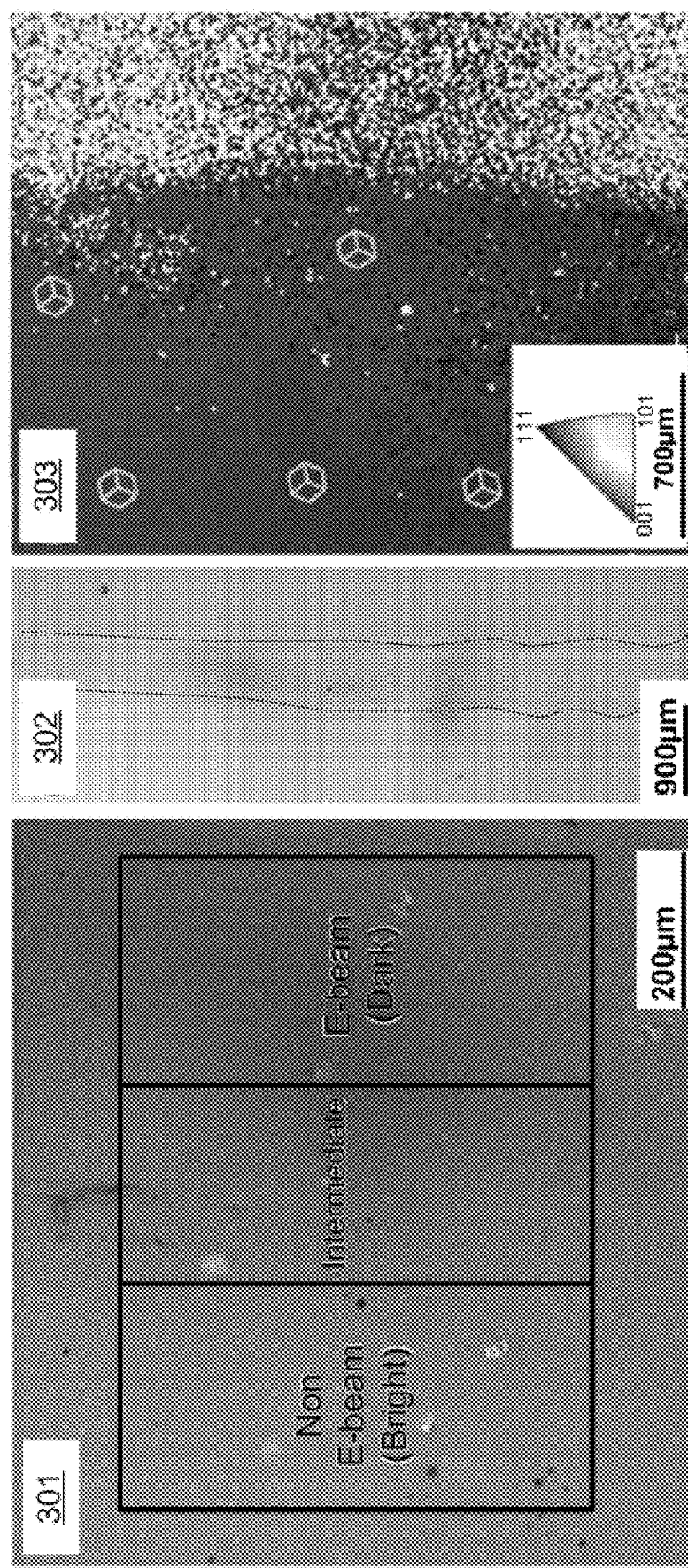
FIG. 3 is a compilation of scanning electron microscope ("SEM") images of a SiGe film at zero degree tile, low magnification, at 70 degree tilt, and crystal orientation mapping with Electron Backscatter Diffraction ("EBSD").
Figure 4:
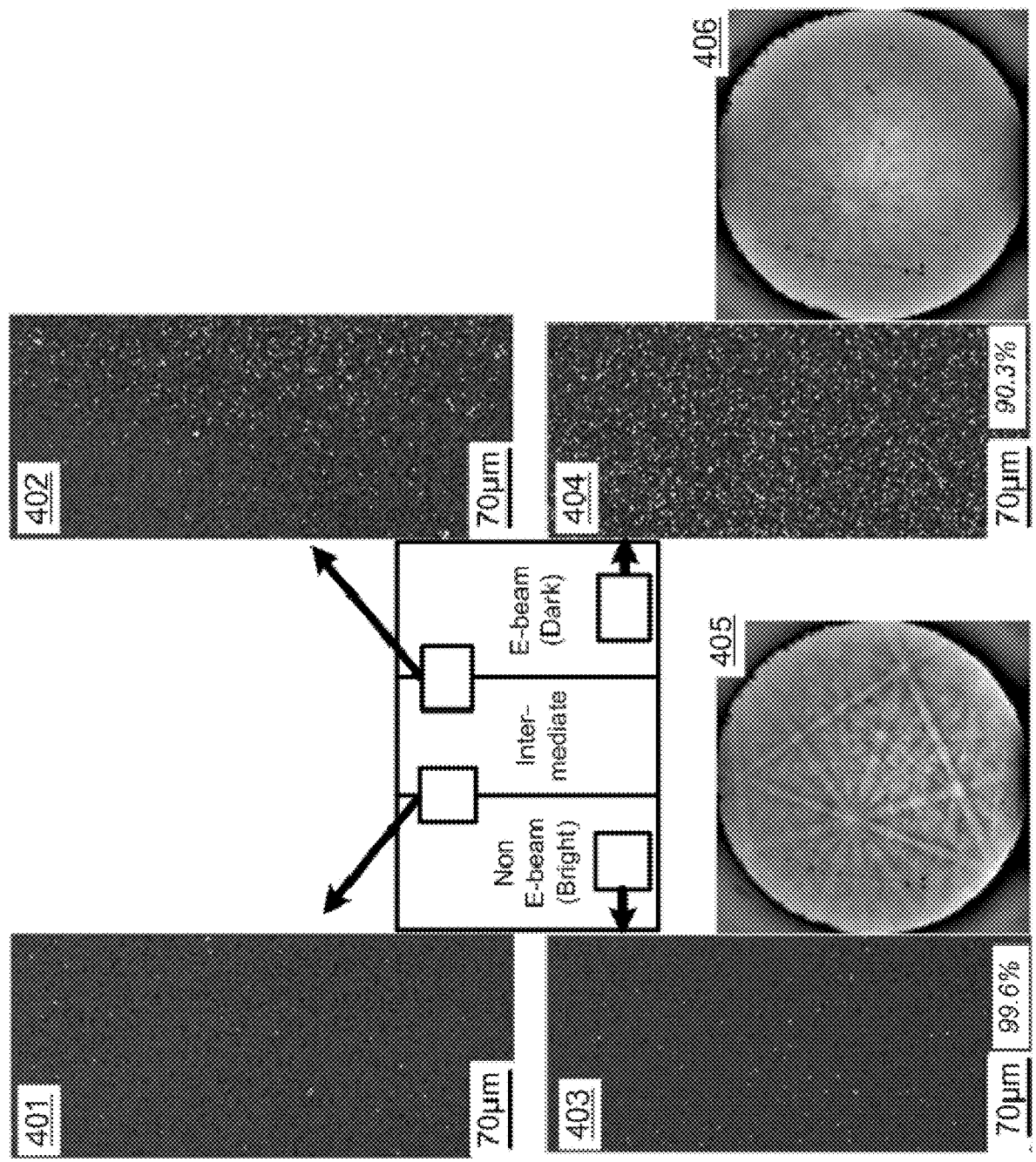
FIG. 4 is a compilation of SEM images and secondary electron diffraction pattern images of a 99.6% single crystal SiGe film with no beam irradiation and a 90.3% single crystal SiGe film with beam irradiation.

To illustrate aspects of the various embodiments, a 99.6% single crystal SiGe film was grown at 890° C. growth temperature, a 5-sccm of high-purity argon gas, and 5 mTorr chamber pressure. The SiGe sample was transferred to the vacuum chamber with a flood electron beam gun assembly (for example, Kimball Physics Inc. models EGF-6115 and EGPS-6115). The electron beam was used to expose a half surface of the SiGe sample for 1 hour. The beam voltage was set to 10 kV, giving a beam current of 0.427 mA (and filament=1.337V/4.257 A, $1^{st}$ Anode=250V). FIGS. 3 and 4 are the SEM images of SiGe film with crystal orientation mapping as analyzed by electron backscatter diffraction ("EBSD"). FIG. 3 includes a SEM image at 0 degree tilt (301), a low magnification SEM image at 70 degree tilt (302), and a gray scale image of the SiGe film with crystal orientation mapping as analyzed by EBSD (303). There are three parts in the two SEM images 301 and 302. The left side of image in 301 shows a slightly bright surface portion which was not exposed to the e-beam. On the other hand, the right side was exposed to the e-beam, and shows relatively dark. There is an intermediate part between the bright and dark area because reflected or secondary electrons might effectively spread over the region between the exposed and unexposed sides. The area between the dotted lines in picture 302 is the inter-boundary region between the not exposed and exposed areas. In image 303, a few line-art cubic shapes are drawn to indicate the crystal orientation of each domain. The same-colored area indicates the unexposed region having similar crystal orientation. Majority of the area is a single shading domain, which is a [1 1 1]-oriented majority single-crystal region. The EBSD shows that a long range order of the e-beam exposed area was reduced, as indicated by the difference in shading in the exposed region. This means the majority crystal orientation was restructured into a different orientation. FIG. 4 shows the EBSD results at higher magnification. FIG. 4 shows the results at the inter-boundary region between the non-e-beam exposed region and intermediate region (picture 401), the inter-boundary region between the e-beam exposed region and the intermediate region (picture 402), the non-e-Beam exposed region (picture 403), and the e-beam exposed region (picture 404). The ratio of [1 1 1]-oriented majority single-crystal region was decreased from 99.6% to 90.3% by e-beam irradiation as illustrated by the relative change in speckling from picture 403 to 404. The intensity of the secondary electron diffraction pattern measured at one point in each side was clearly decreased by e-beam exposure as illustrated by the comparison of secondary electron diffraction intensities in pictures 405 and 406. During the electron irradiation, the electron energy greater than that of structural bonding energy caused a large number of dangling bonds to be broken off by e-beam collisions. Subsequently, reorganization of broken-off dangling bonds within a crystalline structure may be followed up with forming short/long range disorders as is made apparent from the EBSD results illustrated in FIGS. 3 and 4.

Figure 5:
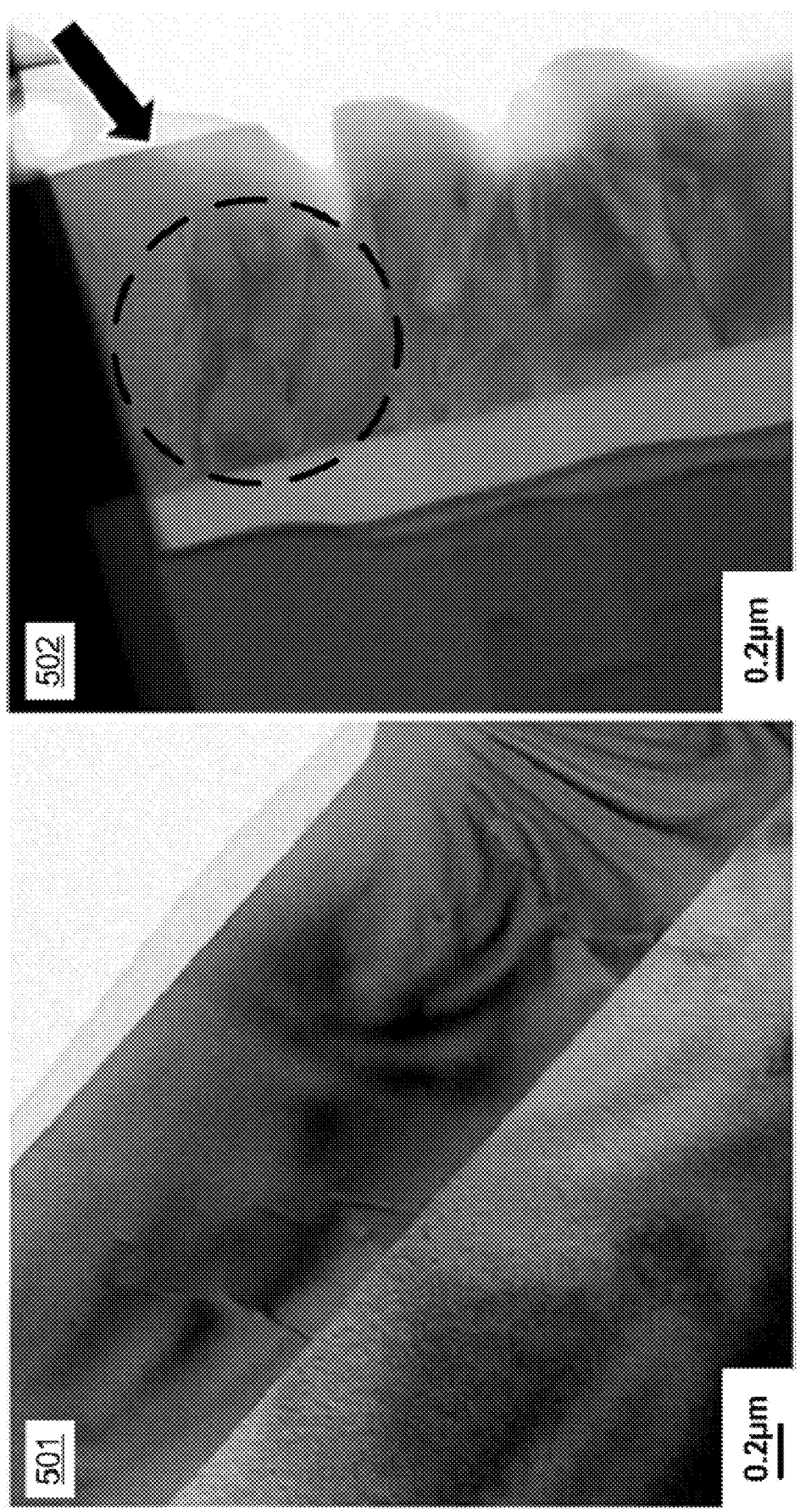
FIG. 5 is a compilation of cross sectional TEM images of SiGe film areas with and without e-beam irradiation.

FIG. 5 shows the TEM bright field images of a sample before (picture 501) and after exposure (502) to irradiation. The cross sectional TEM images 501 and 502 show an area without electron bean irradiation (501) and an area irradiated with a beam current of 0.427 mA during a 1 hour period (502). The arrow in picture 502 indicates that the morphology of the SiGe film was maintained by a protecting layer applied after e-beam irradiation considering that the film of the part where the protecting layer was applied remained flat. Picture 502 shows the formation of more twins and dislocations after the e-beam irradiation. The morphological deformation shown in picture 502 may be a desirable result for retarding the transmission of thermal energy within a bulk material. After the excessive milling by focused ion beam (FIB), the TEM image shows the morphological variation (within the dotted circle in picture 502) within the epitaxial layer beneath a protecting layer. Although the surface under the protecting layer may be flat, underneath of flat surface the originally ordered structure may be severely disintegrated in comparison to the initial internal structural order. In other words, more twins and dislocations may be introduced beneath the flat surface and elsewhere too. The embedded stacking faults and twin structures may give a clear benefit to decrease the thermal conductivity by scattering the lattice vibration-phonon.

Figure 6:
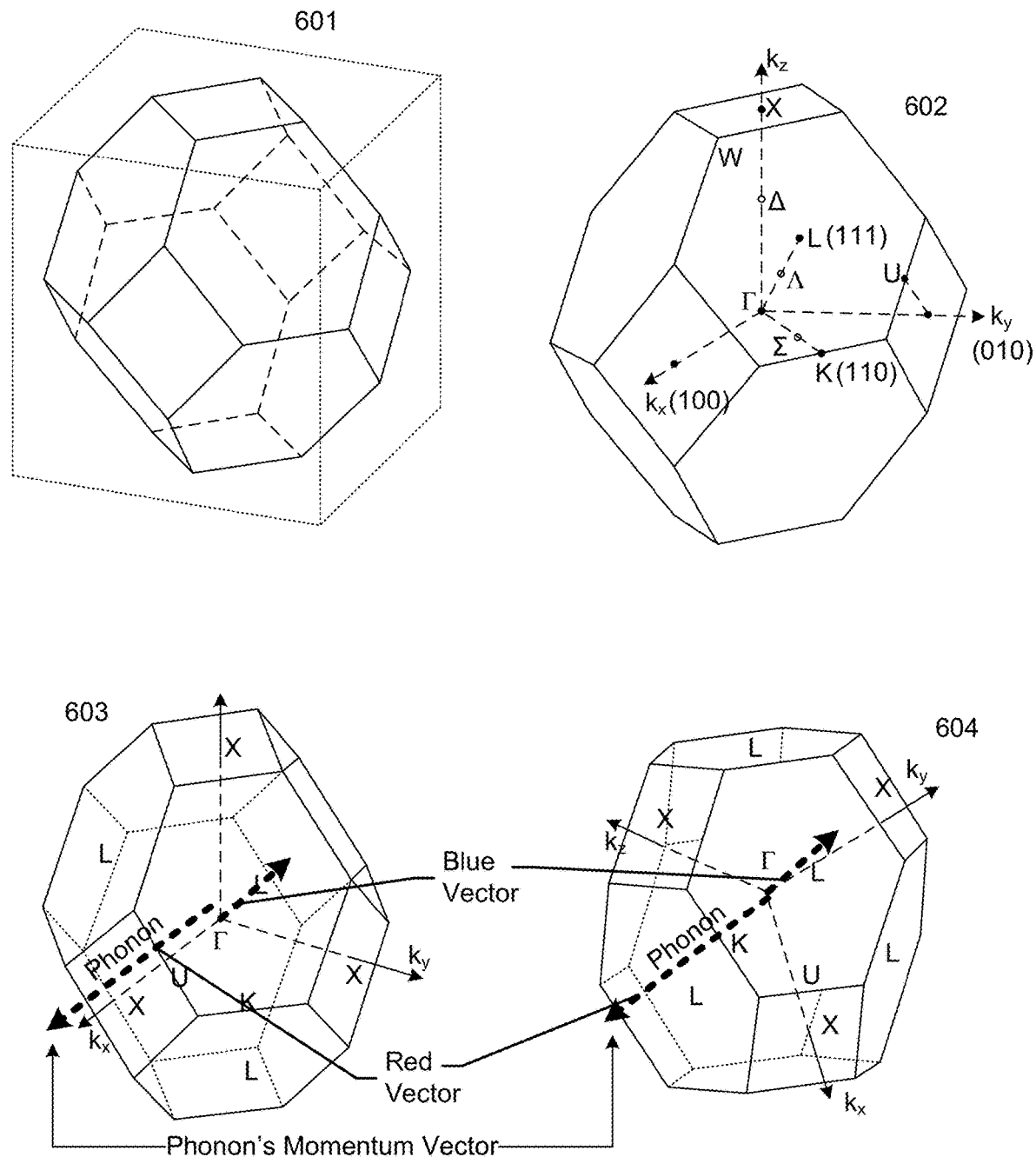
FIG. 6 is a schematic diagram of the First Brillouin Zone of diamond structure illustrating phonon scattering in the reciprocal lattice for different crystal orientations.

In order to understand the effect of twin structure on thermal property, the phonon dispersion in the reciprocal lattice of diamond structure should be considered. The unit cell of the reciprocal lattice is the First Brillouin Zone as shown in FIG. 6. Graph 601 illustrates the First Brillouin Zone of diamond structure, graph 602 the orientation names and Miller indices in the First Brillouin Zone, graph 603 the relative orientation of First Brillouin Zones in diamond crystal, and graph 604 the twin crystal made by stacking faults. The name of each crystal orientation is given with Miller indices. Note as shown in graph 602, that [111] direction is called as L-point direction at X-point and [110] direction is called as K-point. Similarly, halfway to L-point is A-point, halfway to X-point is A-point, and halfway to K-point is Z-point.

Twin crystal made by stacking faults may have various effects. The twin crystal may be rotated by 60 degree in the {111} plane from the underlying crystal. Therefore, the First Brillouin Zone inside the twin crystal may be rotated by 60 degree in {111} plane as shown in graphs 603 and 604. The traveling phonon moves in the [111] direction and the L-point is drawn in the blue dotted vector (labeled "blue vector"). The length of this vector is the momentum of the phonon. In the twin crystal's First Brillouin zone, the blue phonon travels the same direction (L-point) as the original crystal. On the other hand, the traveling phonon (red dotted vector, labeled "red vector") in x-point in the original crystal will be headed into a new orientation, the L-point in the twin crystal made by stacking fault. Therefore when a phonon near X-point in original crystal enters the twin crystal, it will go into L-point phonon bands of the twin crystal by the conservation of momentum. However, the phonon band in L-point in twin crystal has different energy from the X-point phonon band in original crystal. Therefore, the phonon in twin crystal cannot propagate as it did in the original crystal. In order to conserve the momentum and energy of the traveling phonon in X-point of the original crystal, the phonon will be scattered. Therefore, the stacking fault and twin in this embodiment material design may give rise to phonon scattering effect without breaking the channel of electron transport. Because the stacking fault by twin structure is an atomic scale phenomenon, a high density of scattering effect with in-situ/ex-situ electron beam irradiation on SiGe film may be very large, resulting in the large reduction of thermal conductivity.

Figure 7:
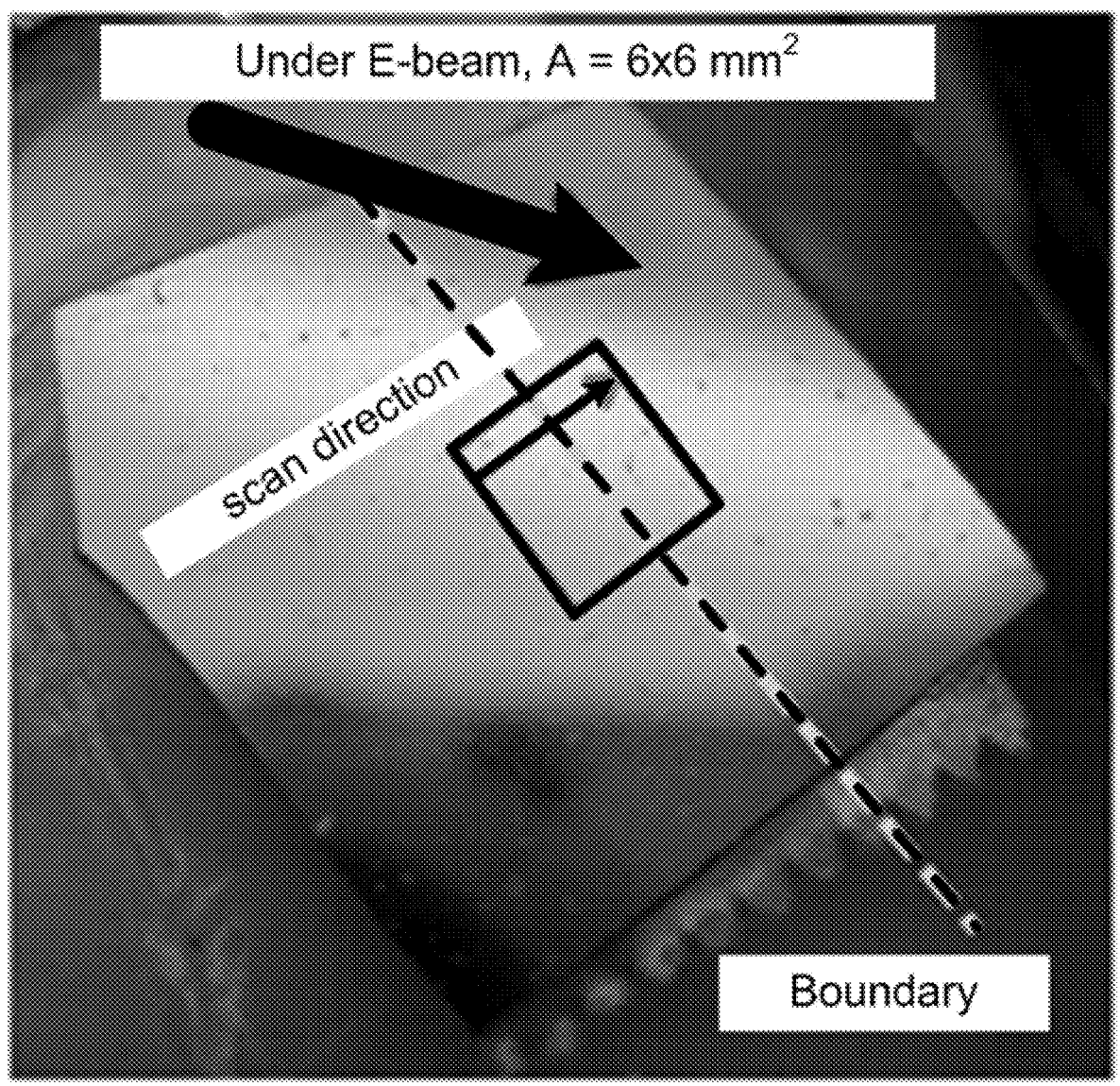
FIG. 7 is an image of a sample film illustrating the scan direction.

The Seebeck coefficient indicates the amount of voltage ($\Delta V$) that develops from a given temperature difference ($\Delta T$) in a material, which is given by the equation $S=\Delta V/\Delta T$. Experimentally, a single data point of the Seebeck coefficient may be achieved by measuring the temperatures at two different locations on a sample, and the voltage across these locations may be measured simultaneously. Table 1 shows the Seebeck scanning data for the sample film a photograph of which is shown in FIG. 7 along with the scan direction.

The scanned area is 6 mm×6 mm, with a data point interval of 600 μm. The average temperature of the sample is ~47° C. and ΔT is 21° C. as determined from the data shown in Table 2 and Table 3 respectively. The absolute value of the Seebeck coefficient is shown in Table 1. As indicated in Table 1 the deviation of the Seebeck coefficient between SiGe film with and without electron beam irradiation is ±10 μV/K. The similar sized, engineered structures with electron beam may decouple the Seebeck coefficient and electrical conductivity due to electron filtering that could result in high ZT. The electric conductivity and doping concentration of the same sample were measured. Although twins, dislocations and stacking faults are formed by the electron beam irradiation, doping concentration and electrical conductivity of the area with electron beam irradiation were similar to those of the area without electron beam irradiation. A very high electric conductivity, σ=630 (/ohm-cm), was achieved at the heavy p-doping of $5.7 \times 10^{19}$ atoms/cm$^3$ for $Si_{0.15}Ge_{0.85}$ alloy at 300K. This value may be between single crystalline p-type Si and single crystalline p-type Ge. Therefore this data indicates that the electrical conductivity of twinned SiGe with electron beam irradiation may also be comparable to single crystalline SiGe. Good thermoelectric materials may be found within a wide range of effective masses and mobilities: from low-mobility, high-effective-mass polaron conductors like oxides and chalcogenides to high-mobility, low-effective-mass semiconductors like SiGe and GaAs. High carrier mobility of single crystal SiGe may improve the efficiency of thermoelectric devices since the electrical conductivity (σ) and electrical resistivity (ρ) may be related to carrier concentration (n) through the carrier mobility μ: $1/\rho = \sigma = ne\mu$.

TABLE 1

Seebeck Coefficient (μV/K)

| | | | | | | | | | |
|---|---|---|---|---|---|---|---|---|---|
| 140.77  | 157.514 | 162.066 | 162.066 | 145.009 | 162.834 | 154.051 | 190.765 | 126.336 | 171.091 |
| 145.152 | 168.029 | 157.483 | 139.38  | 156.295 | 180.966 | 135.091 | 164.271 | 182.268 | 169.381 |
| 160.883 | 151.11  | 156.172 | 158.604 | 153.582 | 166.568 | 139.815 | 142.003 | 161.537 | 168.493 |
| 145.263 | 161.045 | 162.218 | 166.02  | 164.007 | 144.542 | 166.336 | 167.301 | 122.016 | 152.618 |
| 145.351 | 152.212 | 167.634 | 159.486 | 140.94  | 145.285 | 139.852 | 162.265 | 151.973 | 175.414 |
| 148.21  | 162.003 | 168.344 | 152.809 | 149.517 | 162.767 | 152.95  | 176.422 | 146.92  | 162.536 |
| 145.98  | 163.471 | 158.168 | 156.287 | 162.545 | 150.642 | 144.984 | 141.338 | 235.529 | 152.455 |
| 160.332 | 150.974 | 165.162 | 148.678 | 150.08  | 152.152 | 170.994 | 167.37  | 155.076 | 151.106 |
| 141.592 | 143.727 | 156.741 | 151.338 | 151.203 | 156.409 | 170.852 | 322.233 | 251.858 | 151.197 |
| 157.959 | 141.235 | 155.461 | 154.256 | 161.599 | 152.18  | 115.571 | 242.788 | 152.957 | 164.971 |

TABLE 2

Temperature Average (° C.)

| | | | | | | | | | |
|---|---|---|---|---|---|---|---|---|---|
| 46.53  | 45.91  | 46.105 | 47.055 | 46.715 | 46.11  | 46.23  | 47.11  | 46.775 | 46.79  |
| 46.52  | 47.315 | 47.335 | 45.86  | 46.895 | 46.995 | 47.475 | 47.065 | 46.82  | 47.55  |
| 47.225 | 46.84  | 46.835 | 47.4   | 47.605 | 46.935 | 46.63  | 47.24  | 47.425 | 46.935 |
| 45.96  | 47.055 | 47.36  | 47.115 | 46.35  | 47.095 | 47.545 | 47.205 | 47.195 | 47.3   |
| 47.815 | 47.76  | 47.48  | 47.15  | 46.715 | 47.355 | 47.165 | 46.915 | 47.75  | 47.685 |
| 47.385 | 47.11  | 47.715 | 47.925 | 47.8   | 47.34  | 47.745 | 48.25  | 47.85  | 47.385 |
| 47.905 | 48.205 | 48.075 | 47.68  | 47.34  | 47.64  | 47.75  | 47.26  | 47.665 | 48.095 |
| 48.285 | 47.915 | 48.59  | 48.625 | 48.22  | 47.495 | 47.725 | 48.335 | 48.24  | 47.175 |
| 47.65  | 48.01  | 47.75  | 47.19  | 47.18  | 48.18  | 48.305 | 47.78  | 47.425 | 47.715 |
| 48.045 | 47.13  | 47.555 | 47.815 | 47.765 | 47.88  | 47.36  | 47.23  | 48.28  | 48.06  |

TABLE 3

Delta T (° C.)

| | | | | | | | | | |
|---|---|---|---|---|---|---|---|---|---|
| 11.78 | 11.24 | 11.33 | 11.69 | 11.55 | 12.1  | 11.36 | 11.8  | 11.75 | 11.94 |
| 11.34 | 11.57 | 11.33 | 13.5  | 11.25 | 12.21 | 11.95 | 11.67 | 11.36 | 11.96 |
| 11.49 | 11.42 | 11.33 | 11.74 | 11.59 | 11.89 | 11.62 | 12.42 | 12.15 | 12.09 |
| 12.9  | 13.35 | 13.36 | 12.63 | 12.24 | 12.83 | 12.69 | 12.31 | 11.99 | 12.02 |
| 12.07 | 11.66 | 11.48 | 11.28 | 14.91 | 12.05 | 11.91 | 11.87 | 12.04 | 12.39 |
| 11.85 | 11.22 | 11.63 | 11.67 | 11.36 | 11.8  | 12.45 | 12.08 | 12.06 | 11.23 |
| 11.05 | 11.87 | 11.31 | 11.22 | 11.1  | 11.6  | 11.86 | 11.42 | 12.05 | 11.71 |
| 11.59 | 11.59 | 11.76 | 11.53 | 11.32 | 11.59 | 11.75 | 11.87 | 11.96 | 13.33 |
| 12.7  | 12.84 | 12.2  | 11.98 | 11.9  | 12.58 | 12.51 | 12.26 | 12.05 | 12.07 |
| 12.01 | 13.48 | 12.07 | 13.29 | 12.67 | 13.04 | 12.76 | 12.64 | 13.28 | 12.74 |

Figure 8:
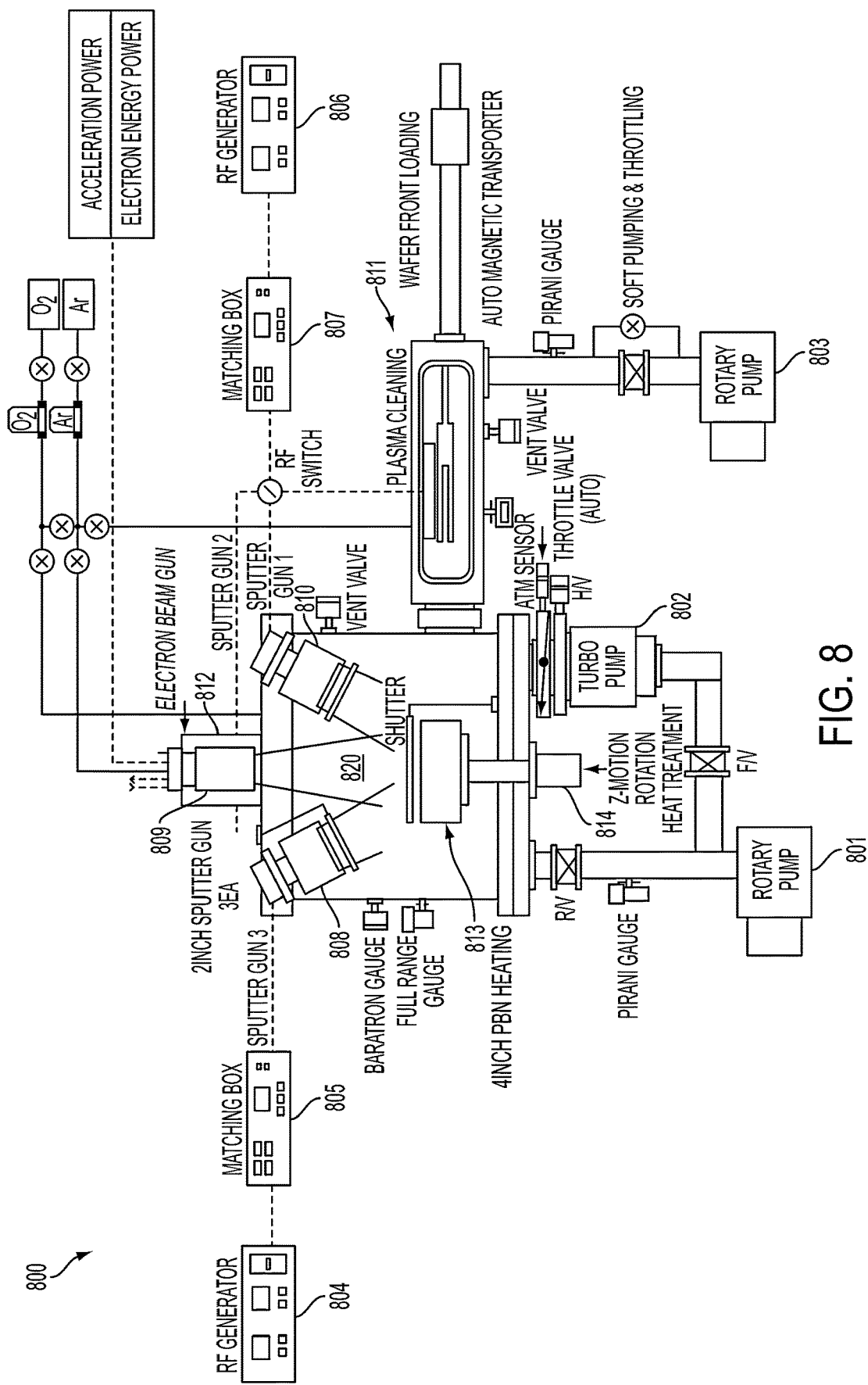
FIG. 8 is a component block diagram of an embodiment Electron Beam Irradiation Sputtering ("EBIS") system for noble thermoelectric material design.

FIG. 8 is a component block diagram of an embodiment Electron Beam Irradiation Sputtering ("EBIS") system 800 for noble thermoelectric material design. The EBIS system 800 may include one or more vacuum pump, such as (rotary pumps 801 and 803, turbomolecular pump 802, ion pump, etc), DC/RF power supplies 804 and 806 with matching boxes 805 and 807, respectively, one or more sputtering gun, such as sputtering guns 808, 809, and 810, various pressure sensors, load-lock system with plasma cleaning 811, electron beam gun 812, various valves, and a system controller (switching connected with interlock to control the various operations of the system 800). For example, the system controller may include a processor configured with processor-executable instructions to perform operations to control pump switching, venting, electric, air, water, and mechanical switching, and the activation and deactivation of the electron beam gun 812 and/or sputtering guns 808, 809, and/or 812. The chamber 820 of the system 800 may be kept at high vacuum ($<1 \times 10^{-7}$ Torr). The substrate heater/holder 813 may mount a 6" wafer, and the in-vacuum wafer transfer and the heating temperature must reach at least 1200° C. Thermo-couple sensor nearby the wafer may need to read the temperature and horizontal rotations may need to be performed. The horizontal rotation module 814 may rotate the 6" wafer 3600 continuously and may stop at any user controlled angle with 0.5 degree accuracy. The horizontal rotation speed may be at least 5 RPM. The gap between heater and substrate holder may be controlled using Z-motion. The EBIS system 800 may include three sputtering guns with two DC and one RF power supplies for silicon, germanium, and doping elements. The electron beam parameters such as current density and pulse width, as well as, gas flow rate of the electron source assembly may be controlled.

From the above results, stacking faults and twins structure may be formed after film growth is finished by ex-situ electron beam irradiation. Using the sputtering system 800 design as shown in FIG. 8, the volume of twins, stacking faults for phonon scattering site may be controlled by adjusting the e-beam irradiation method (in-situ or ex-situ), current density and pulse time of e-beam irradiation. Also, a variety of thin film structures, such as infinite sandwich structures with single crystalline films with and without phonon scattering site, may be created.

The following illustrates an example twin lattice structure for forming a series of stacking faults within vertical structure of material in detail. To enhance thermoelectric performance, it may be necessary to control the quantities S, a, and k independently so that ZT may be increased. This may be because an increase in S usually results in a decrease in a, and a decrease in a may produce a decrease in the electronic contribution to k. However, if the dimension of the material (such as superlattice (2D), Quantum wires (1D), and Quantum dot (0D)) is decreased, it is possible to cause dramatic differences in the density of electronic states, allowing new opportunities to vary S, σ, and k quasi-independently when the length scale is small enough to give rise to quantum-confinement effects as the number of atoms in any direction (x, y, or z) becomes small. Furthermore, the introduction of many interfaces, which scatter phonons more effectively than electrons, or serve to filter out the low-energy electrons at the interfacial energy barriers, allows the development of nanostructured material with enhanced ZT. The following is the calculation results for the required time to form the twin lattice with 5 nm thickness in using the TEM electron beam according to an embodiment.

Power=300 kV (TEM accelerating voltage)×5.2 nA (current density)=1.56 [mW]=1.56 [mJ/sec]. Heat is a form of energy that cannot be measured directly. When a substance is heated or cooled, the heat gained or lost, Q depends upon the mass m of the substance, the specific heat of the substance C, and the substance's change in temperature, ΔT. Q [J]=mCΔT (heat energy exchanged=mass×specific heat capacity×change in temperature). m=ρV=5.068 [g/cm$^3$]×6 [inch]×6 [inch]×5 [nm], (at 6 inch size wafer and 5 nm thickness). Specific heat of $Si_{1-x}Ge_x$=(19.6+2.9×) [J/mol·K]= 0.334 [J/g·K] in $Si_{0.15}Ge_{0.85}$. ∴ Q=0.2306 [J]

Figure 9:
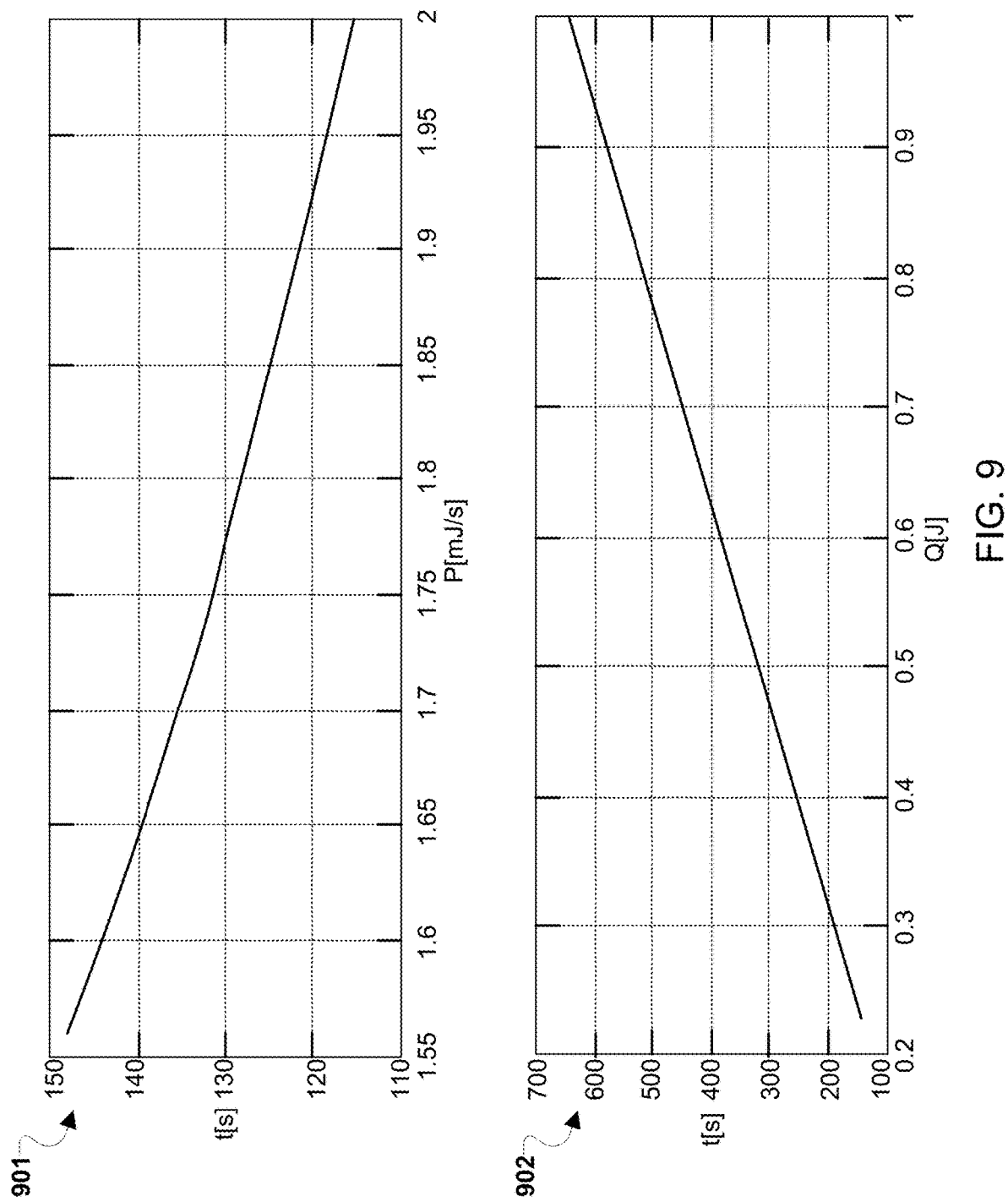
FIG. 9 illustrates comparison graphs of the required time of e-beam irradiation pulse versus change in heat energy and change in power.

From the above result, 148 sec was needed to form the 5 nm twin lattice structure of SiGe with TEM electron beam. If an e-beam gun with high energy is used, the required time can be reduced. FIG. 9 compares the required time of electron beam irradiation pulse with change of heat energy and power.

The various embodiments may get closer to a 'phonon glass' while maintaining the 'electron crystal.' These reduced lattice thermal conductivities may be achieved in the various embodiments through phonon scattering across various length scales with twin, dislocation, and stacking fault. A reduced lattice thermal conductivity directly improves the thermoelectric efficiency, ZT, and additionally allows re-optimization of the carrier concentration for additional ZT improvement. The various embodiments enable growing the SiGe film at relative high temperature for the single crystalline properties and by controlling the amount of twins or dislocation through either in-situ or ex-situ electron-beam irradiation. This can maintain (or increase) the Seeback coefficient and electrical conductivity and simultaneously decrease the thermal conductivity.

Figure 10:
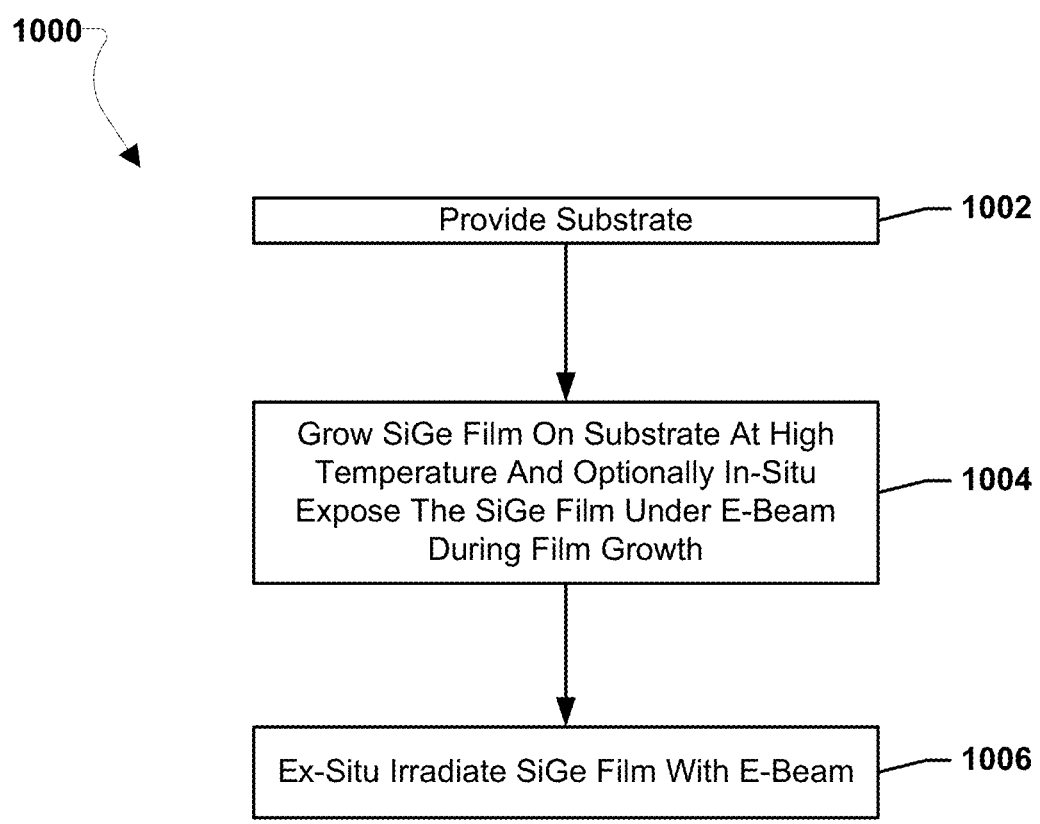
FIG. 10 is a process flow diagram illustrating an embodiment method for growing a SiGe film using e-beam irradiation.

FIG. 10 is a process flow diagram illustrating an embodiment method 1000 for growing a SiGe film using e-beam irradiation. In block 1002 a substrate may be provided on which a SiGe film may be grown. In an embodiment, the substrate may be a trigonal substrate, such as a c-plane sapphire. In block 1004 a doped SiGe film may be grown on the substrate at a high temperature and optionally may be in-situ exposed under an e-beam during film growth. A high temperature may be a temperature at or above about 800 degrees Celsius, such as about 800 degrees Celsius to about 890 degrees Celsius, such as about 890 degrees Celsius, such as about 890 degrees Celsius to about 12000 degrees Celsius, such as about 1200 degrees Celsius, such as above about 1200 degrees Celsius, etc. For example, a SiGe film may be grown on the substrate by sputter depositing doped SiGe at a temperature of 890 degrees Celsius with a 5 standard cubic centimeters per minute (sccm) flow of argon gas, and a chamber pressure of 5 millitorrs (mTorr). As another example, the SiGe film may be grown on the substrate by sputter depositing doped SiGe at a temperature of at least 1200 degrees Celsius. The SiGe may be sputtered using three sputtering guns providing the silicon, germanium, and doping element (e.g., boron for p-type layers or phosphorous for n-type layers, though other doping elements may be used). In an optional embodiment, the SiGe film may be exposed to an e-beam while the film is being grown, i.e., in-situ. The result of the operations of block 1004 may be a single crystal SiGe film with the orientation of most crystals being the same. In block 1006 the SiGe film may be irradiated with an e-beam ex-situ to restructure the crystal orientation in a different orientation, such as 60 degrees rotation of the twinned crystal in the {111} plane, resulting a twinned SiGe alloy (e.g., twinned SiGe film) with a high density of stacking faults and twin crystals. For example, the SiGe film may be irradiated with a flood electron beam gun assembly for a period of time, such as 1 hour, and a beam voltage of 10 kV giving a beam current of 0.427 mA. As another example, the SiGe film may be irradiated with electron beam radiation from a TEM for 1 hour at 195 K magnification. As discussed above, the irradiation of the SiGe may occur in-situ and/or ex-situ. The irradiation of the SiGe film in block 1006 may impart twin crystal structures, dislocations, and stacking faults to the SiGe film that may reduce lattice thermal conductivities through phonon scattering across various length scales. A reduced lattice thermal conductivity may directly improve the thermoelectric efficiency, ZT, and additionally allows re-optimization of the carrier concentration for additional ZT improvement. The operations of method 1000 may enable growing the SiGe film at relative high temperature for the single crystalline properties and controlling the amount of twins or dislocation through either in-situ or ex-situ electron-beam irradiation. This may maintain (or increase) the Seeback coefficient and electrical conductivity and simultaneously decrease the thermal conductivity.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method, comprising:
growing a doped single crystal SiGe film on a substrate at a temperature at or above 800 degrees Celsius, the SiGe film having a first crystal orientation structure; and
irradiating an area of the doped single crystal SiGe film with an electron beam for a required time to produce a second crystal orientation structure different from the first crystal orientation structure, the second crystal orientation structure including one or more stacking faults.

2. The method of claim 1, wherein the substrate is a trigonal substrate.

3. The method of claim 2, wherein the trigonal substrate is a c-plane sapphire.

4. The method of claim 1, wherein the temperature is at least 890 degrees Celsius.

5. The method of claim 4, wherein the temperature is at least 1200 degrees Celsius.

6. The method of claim 4, wherein the electron beam is a transmission electron microscope beam or an electron beam gun beam.

7. The method of claim 6, wherein the required time is at least 148 seconds to form a 5 nm twin lattice structure.

8. The method of claim 7, wherein the required time is one hour.

9. The method of claim 1, wherein growing the doped single crystal SiGe film comprises sputtering Si, Ge, and a doping element on the substrate at the temperature at or above 800 degrees Celsius.

10. The method of claim 1, wherein irradiating the doped single crystal SiGe film is conducted in-situ.

11. The method of claim 1, wherein irradiating the single crystal doped SiGe film is conducted ex-situ to result in a twinned SiGe film.

12. A method comprising:
providing a trigonal substrate;
growing a doped single crystal SiGe film on the trigonal substrate at a temperature of more than about 800° C. by sputter depositing doped SiGe on the trigonal substrate, the SiGe film having a first crystal orientation structure; and
irradiating the doped single crystal SiGe film with an electron beam for a required time to produce a second crystal orientation structure different from the first crystal orientation structure, the second crystal orientation structure including one or more stacking faults.

13. The method of claim 12, wherein the irradiating the doped single crystal SiGe film is conducted in situ.

14. The method of claim 12, wherein irradiating the doped single crystal SiGe film is conducted ex situ to rotate the first crystal orientation to the second crystal orientation structure.

15. The method of claim 14, wherein the second crystal orientation structure is 60° rotation in a {111} plane.

16. The method of claim 12, wherein the irradiating is conducted with an electron beam gun assembly or electron beam radiation from a TEM.

17. The method of claim 12, further comprising controlling amounts of twins or stacking faults in the doped single crystal SiGe film.

18. The method of claim 12, further comprising:
maintaining or increasing a Seeback coefficient and electrical conductivity of the doped single crystal SiGe film; and
decreasing thermal conductivity of the doped single crystal SiGe film by producing stacking faults and twin lattice structures in the single crystal doped single crystal SiGe film.

* * * * *